United States Patent
Matsuoka

(10) Patent No.: US 6,479,356 B1
(45) Date of Patent: Nov. 12, 2002

(54) METHOD OF MANUFACTURING A SEMICONDUCTIVE DEVICE WITH AN ENHANCED JUNCTION BREAKDOWN STRENGTH

(75) Inventor: Takeru Matsuoka, Tokyo (JP)

(73) Assignee: Mitsubishi Denki Kabushi Kaisha, Tokyo (JP)

( * ) Notice: Subject to any disclaimer, the term of this patent is extended or adjusted under 35 U.S.C. 154(b) by 0 days.

(21) Appl. No.: 09/580,482

(22) Filed: May 30, 2000

Related U.S. Application Data

(62) Division of application No. 09/226,162, filed on Jan. 7, 1999, now Pat. No. 6,081,007.

(30) Foreign Application Priority Data

Jul. 31, 1998 (JP) .......................................... 10-217941

(51) Int. Cl.[7] ............................................ H01L 21/336
(52) U.S. Cl. ...................... 438/289; 438/290; 438/291; 438/303; 438/305; 257/285; 257/657; 257/917
(58) Field of Search ................................ 438/174, 175, 438/291, 194, 514, 289, 290, 305, 303, 307; 257/285, 657, 917

(56) References Cited

U.S. PATENT DOCUMENTS

| | | | |
|---|---|---|---|
| 4,514,893 A | 5/1985 | Kinsbron et al. | 438/289 |
| 4,949,136 A | 8/1990 | Jain | 257/344 |
| 5,183,771 A | 2/1993 | Mitsui et al. | 438/302 |
| 5,219,777 A * | 6/1993 | Kang | 438/291 |
| 5,359,221 A | 10/1994 | Miyamoto et al. | 257/408 |
| 5,466,957 A | 11/1995 | Yuki et al. | 257/344 |
| 5,548,148 A | 8/1996 | Bindal | 257/335 |
| 5,552,329 A * | 9/1996 | Kim et al. | 438/291 |
| 5,597,752 A * | 1/1997 | Niwa | 438/291 |
| 5,605,855 A * | 2/1997 | Chang et al. | 438/291 |
| 5,698,461 A * | 12/1997 | Liu | 438/291 |
| 5,773,348 A * | 6/1998 | Wu | 438/305 |
| 5,817,558 A * | 10/1998 | Wu | 438/291 |
| 5,856,226 A * | 1/1999 | Wu | 438/291 |
| 5,869,374 A * | 2/1999 | Wu | 438/291 |
| 5,895,954 A | 4/1999 | Yasumura et al. | 257/345 |
| 5,904,530 A * | 5/1999 | Shin | 438/291 |
| 5,933,738 A * | 8/1999 | Kao et al. | 438/291 |
| 6,025,235 A * | 2/2000 | Krivokapic | 438/289 |
| 6,037,194 A * | 3/2000 | Bronner et al. | 438/147 |
| 6,169,003 B1 * | 1/2001 | Hu et al. | 438/299 |

FOREIGN PATENT DOCUMENTS

| | | |
|---|---|---|
| JP | 404096278 | 3/1992 |
| JP | 5-235342 | 9/1993 |

* cited by examiner

Primary Examiner—Eddie Lee
Assistant Examiner—José R. Diaz
(74) Attorney, Agent, or Firm—McDermott, Will & Emery

(57) ABSTRACT

A gate insulating film and gate electrodes are formed on a substrate containing N-type impurities such as P or As. Under the gate insulating film is a gate region on both sides of which are a first and a second source drain region. The gate region is furnished in its central part with a high-concentration channel injection region containing N-type impurities at a concentration higher than that of the substrate. Between the high-concentration channel injection region on the one hand and the first and the second source drain region and on the other hand, there are formed a first and a second low-concentration channel injection region and having substantially the same impurity concentration as that of the substrate.

3 Claims, 6 Drawing Sheets

*PRIOR ART*

METHOD OF MANUFACTURING A SEMICONDUCTIVE DEVICE WITH AN ENHANCED JUNCTION BREAKDOWN STRENGTH

This application is a Divisional of application Ser. No. 09/226,162 filed Jan. 7, 1999 now U.S. Pat. No. 6,081,007.

BACKGROUND OF THE INVENTION

1. Field of the Invention

The present invention relates to a semiconductor device and a method for manufacturing the same. More particularly, the invention relates to a semiconductor device structured to make MIS transistors therein smaller than before, and to a method for manufacturing the semiconductor device thus structured.

2. Description of the Background Art

There exists a known scaling rule that defines rules for designing MIS (metal insulator semiconductor) transistors. The MIS transistor has a gate insulating film constituted illustratively by an oxide film. On both sides of the gate insulating film are an electrode made of a metal and a gate region composed of a semiconductor. Impurities of a predetermined density are diffused throughout the semiconductor making up the gate region. According to the scaling rule above, if the gate length of the transistor is 1/K, then the density of impurities to be diffused in the gate region must be multiplied by a factor of K.

FIG. 18 is a cross-sectional view of a former single drain type transistor 10. The transistor 10 has a substrate 12 including a channel injection region 14. Formed near the surface of the channel injection region 14 are a first and a second source drain region 16 and 18. In a region interposed between the first and the second source drain region 16 and 18, the channel injection region 14 is covered with an insulating film 20. On top of the insulating film 20 is provided with a gate electrode 22.

If the former transistor 10 is illustratively an N channel transistor, then the channel injection region 14 must be a P-type semiconductor as well as the first and the second source drain region 16 and 18 must be an N-type semiconductor. The structure above is implemented by implanting impurities such as phosphorus (P) (called N-type impurities hereunder) into the channel injection region 14 and into the two source drain regions 16 and 18, and by implanting impurities such as boron (B) (called P-type impurities hereunder) also into the first and the second source drain region 16 and 18. The N-type impurities should have a concentration high enough to overcome the P-type impurities when implanted into the first and the second source drain region 16 and 18.

The former transistor 10 may be made smaller in size when the concentration of impurities in the channel injection region 14 is increased. However, higher impurity concentrations in the channel injection region 14 tend to increase the probability of carriers such as electrons and holes colliding with impurities in the same region 14. The greater the probability of carriers colliding with impurities in the channel injection region 14, the lower the operating speed of the transistor 10. It follows that as the former transistors 10 are made smaller in size, it becomes increasingly more difficult to maintain their high-speed performance.

Where the concentration of impurities is to be boosted in the channel injection region 14 of the former transistor 10, the impurity concentration in the first and the second-source drain region 16 and 18 thereof must also be increased. This means that as transistors 10 are getting smaller, impurities are more likely to be highly concentrated near PN junctions formed at boundaries between the first or second source drain region 16 or 18 on the one hand and the channel injection region 14 on the other hand.

The breakdown strength of the PN junction decreases as the impurity concentration nearby increases. The capacitance of the PN junction is greater the higher the impurity concentration nearby. For these reasons, it is difficult for former transistors 10 to be made increasingly smaller in size while maintaining their high junction breakdown strength and their low junction capacitance.

Furthermore, the intensity of an electric field generated in the PN junction is greater the higher the concentration of impurities nearby. The higher the field intensity levels of the PN junction, the more likely hot carriers to be appeared inside the transistor 10. As a result, former transistors 10 tend to be less stable in their operation the smaller they are in size. Miniaturization of former single drain type transistors 10 thus involves these and other related problems.

FIG. 19 is a cross-sectional view of another former transistor 24. The structure of the transistor 24 is a known one proposed to solve operation speed-related problems of the single drain type transistor 10. The transistor 24 has a gate region 26 near the surface of a substrate 12. The gate region 26 comprises a first and a second high-concentration channel injection region 28 and 30, as well as a low-concentration channel injection region 32. The first and the second high-concentration channel injection region 28 and 30 are formed near boundaries with the first and the second source drain region 16 and 18 respectively. The low-concentration channel injection region 32 is interposed between the first and the second high-concentration channel injection region 28 and 30.

FIG. 20 is a graphic representation showing impurity concentration levels in the transistor 24 which is taken along line XO-XXO in FIG. 19. Into the substrate 12 and gate region 26 of the transistor 24, impurities of the same type (e.g., P-type impurities such as boron (B)) are implanted. Into the first and the second source drain region 16 and 18, impurities opposite in type to those contained in the substrate 12 and gate region 26 (e.g., N-type impurities such as phosphorus (P)) are implanted. In FIG. 20, a broken line with reference character "Sub" indicates a level of the concentration of impurities in the substrate 12. Reference characters CD, C/D and S/D represent levels of P- or N-type impurities distributed in the low-concentration channel injection region 32, in the first and second high-concentration channel injection region 28 and 30, or in the first and the second source drain region 16 and 18, respectively.

In the former transistor 24, as shown in FIG. 20, the impurity concentration (CD) of the low-concentration channel injection region 32 is set to be slightly higher than the impurity concentration (Sub) of the substrate 12. The impurity concentration (C/D) of the first and the second high-concentration channel region 28 and 30 is established so as to be higher than the impurity concentration (S/D) of the first and the second source drain region 16 and 18 in the transistor 28.

In the transistor 24, PN junctions are formed at boundaries between the first and the second source drain region 16 and 18 on the one hand and the first and the second high concentration channel region 28 and 30 on the other hand. As a result, depletion layers are formed near these boundaries.

Such depletion layers can expand in keeping with fluctuations of a voltage applied to the transistor 24. A depletion layer on the low impurity concentration side tends to be more expansive than a depletion layer on the high impurity concentration side.

For that reason, if the impurity concentration of the first and the second high-concentration channel region 28 and 30 is set to be lower than the impurity concentration of the first and the second source drain region 16 and 18 in the transistor 24, i.e., in the case of a setting opposite to that described earlier (this setting is called the comparative setting hereunder), depletion layers expand mainly on the side of the first and the second high-concentration channel region 28 and 30. In this case, the gate length is reduced in inverse proportion to the depletion layers being expanded. The operation threshold value of transistors varies with changes in their gate length. Thus the comparative setting above makes it difficult to maintain a stable operation threshold value especially when the transistor 24 is small in size.

In the setting of FIG. 20, by contrast, the depletion layers of the transistor 24 expand mainly on the side of the first and the second source drain region 16 and 18. In that case, the gate length of the transistor 24 is kept stable regardless of the depletion layers being expanded. For that reason, the former transistor 24 maintains its stable operation threshold value even when made small in size. In the manner described, the former transistor 24 secures a region of low impurity concentrations, i.e., the low-concentration channel injection region 32, inside part of the gate region 26 without destabilizing the operation threshold value.

In the low-concentration channel injection region 32 of the former transistor 24, the probability of carriers colliding with impurities is reduced. This allows the former transistor 24 to achieve a higher operation speed than the transistor 10 of FIG. 18 while maintaining a stable operation threshold value.

However, in the former transistor 24 of FIG. 19, impurities are highly concentrated near boundaries (i.e., PN junctions) between the first and the second source drain region 16 and 18 on the one hand and the first and the second high-concentration channel injection region 28 and 30 on the other hand. This means that the transistor 24 of FIG. 19, too, is plagued by the same problems as those affecting the transistor 18 of FIG. 18, i.e., a decline in junction breakdown strength, occurrence of a large junction capacitance, and promoted generation of hot carriers.

SUMMARY OF THE INVENTION

The present invention has been conceived to solve the previously-mentioned problems, and a general object of the present invention is to provide a novel and useful semiconductor device and method for manufacturing the same.

A more specific object of the present invention is to provide a semiconductor device capable of maintaining a stable operation threshold value, securing an enhanced level of junction breakdown strength, reducing junction capacitance to a minimum, and suppressing generation of hot carriers.

The above object of the present invention is achieved by a semiconductor device built on a base constituted either by a substrate including first impurities at a first predetermined concentration or by wells which include the first impurities at the first predetermined concentration and which are formed on a substrate. The semiconductor device includes a gate insulating film and gate electrodes formed on the base. The semiconductor device also includes a gate region formed under the gate insulating film. The semiconductor device further comprising a first and a second source drain region provided respectively on opposite sides of the gate region. The gate region is furnished in a central part thereof with a high-concentration channel injection region including at a second predetermined concentration second impurities of a type identical to that of the first impurities. The second concentration is higher than the first predetermined concentration. A first and a second low-concentration channel injection region including the first impurities at the first predetermined concentration are provided between the high-concentration channel injection region on the one hand and the first and the second source drain region on the other hand.

It is another object of the present invention to provide a method for manufacturing easily and reliably the inventive semiconductor device offering the benefits outlined above.

The above object of the present invention is achieved by a method for manufacturing a semiconductor device on a base constituted either by a substrate including first impurities at a first predetermined concentration or by wells which include the first impurities at the first predetermined concentration and which are formed on a substrate. The method includes the following steps. Step of forming on the base an interlayer film having gate-use openings which open onto a gate region; step of forming a side wall of a predetermined thickness over an inner surface of each of the gate-use openings; step of implanting into the gate-use openings ions of second impurities of a type identical to that of the first impurities in order to form, in the vicinity of a surface of the base, a high-concentration channel injection region which is smaller than the gate region and which includes the second impurities at a second predetermined concentration higher than the first predetermined concentration; and step of forming outside the gate region a first and a second source drain region which include third impurities of a type different from that of the first impurities and which are respectively arranged on opposite sides of the gate region.

Other objects and further features of the present invention will be apparent from the following detailed description when read in conjunction with the accompanying drawings.

DESCRIPTION OF THE PREFERRED EMBODIMENTS

Figure 1:
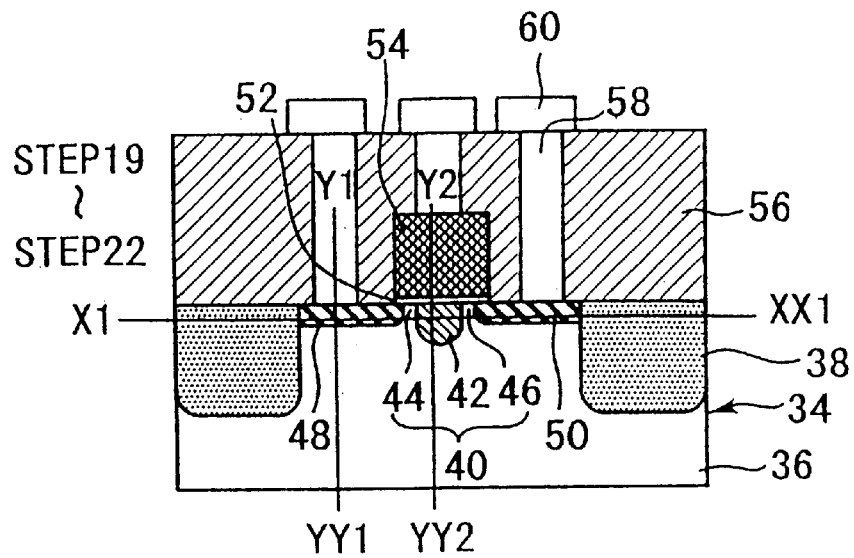
FIG. 1 is a cross-sectional view of a semiconductor device practiced as a first embodiment of this invention.

In the following, principles and embodiments of the present invention will be described with reference to the accompanying drawings. Throughout the drawings, like reference numerals designate like or corresponding parts, and descriptions of such parts are omitted where they are repetitive.

First Embodiment

FIG. 1 is a cross-sectional view of a semiconductor device 34 practiced as a first embodiment of this invention. The semiconductor device 34 may serve as either P- or N-channel transistors. Described below is an example in which the semiconductor device 34 is constituted as a P-channel transistor.

The semiconductor device 34 has a substrate 36. The substrate 36 is an N-type semiconductor that contains N-type impurities (e.g., P or As) at a first predetermined concentration. Instead of being based on the N-type semiconductor, the semiconductor device 34 of the first embodiment may alternatively be built on the basis of N-type semiconductor wells formed in a P-type semiconductor substrate. In the description that follows, the semiconductor device 34 will be shown comprising the N-type semiconductor substrate 36.

The substrate 36 has isolating regions 38. The surface of the substrate 36 is divided into a plurality of island-like element regions by the isolating regions 38. What is shown in FIG. 1 is one of such element regions. In the middle of the element region is a gate region 40. The gate region 40 has at its center a high-concentration channel injection region 42. On both sides of the high-concentration channel injection region 42 are a first and a second low-concentration channel injection region 44 and 46.

The high-concentration channel injection region 42 has the same type of impurities as that of the impurities contained in the substrate 36. They are N-type impurities such as P and As at a second predetermined concentration that is higher than the impurity concentration of the substrate 36 (i.e., first predetermined concentration). The first and the second low-concentration channel injection region 44 and 46 contain substantially the same concentration of impurities as that in the substrate 36.

In each element region of the substrate 36, a first and a second source drain region 48 and 50 are formed on both sides of the gate region 40. The first and the second source drain region 48 and 50 include P-type impurities such as B or $BF_2$ at a third predetermined concentration. The third predetermined concentration is higher than the impurity concentration of the substrate 36 (i.e., the first predetermined concentration) and lower than the concentration of the high-concentration channel junction regions (the second predetermined concentration).

A gate oxide film 52 is formed over the entire surface of the gate region 40. On top of the gate oxide film 52 is a gate electrode 54. The first source drain region 48, the second source drain region 50, and the gate electrode 54 are covered with an interlayer film 56. The interlayer film 56 includes contacts 58 and metal wiring 60 connected to any one of the first source drain region 58, second source drain region 50 and gate electrode 54. The semiconductor device 34 is connected to an external device via the metal wiring 60.

The semiconductor device 34 of the first embodiment has three major characteristics. As the first characteristic, the gate electrode 40 has the first and the second low-concentration channel injection region 44 and 46 interposed between the first and the second source drain region 48 and 50 on the one hand and the high-concentration channel region 42 on the other hand. As the second characteristic, the impurity concentrations of the substrate 36, the high-concentration channel injection region 42, and the first and second source drain region 48 and 50, i.e, the first through third predetermined concentrations satisfies the above-stated relations. The third characteristic involves that an impurity distribution in the high-concentration channel injection region 42 and an impurity distribution in the first and second source drain region 48 and 50 satisfies a given relationship, which will be described later. The effects stemming from these characteristics are described below with reference to FIGS. 2 and 3 as well as FIG. 1.

Figure 2:
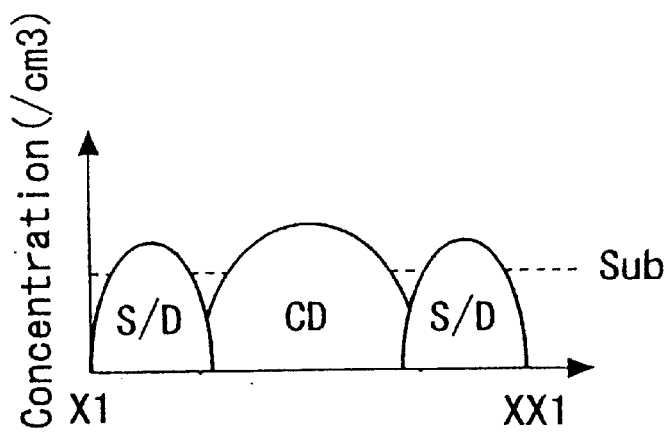
FIG. 2 is a graphic representation showing impurity concentrations in the semiconductor device practiced as a first embodiment of this invention taken along line X1-XX1 in FIG. 1.

FIG. 2 is a graphic representation showing impurity concentrations in the semiconductor device 34 taken along line X1-XX1 in FIG. 1. In FIG. 2, a broken line with reference character "Sub" indicates a level of the concentration of impurities in the substrate 12 (i.e., the first predetermined concentration). A region marked by reference character CD represents a width directional distribution of impurity concentration of N-type impurities contained in the high-concentration channel injection region 42 (i.e., a distribution of the second predetermined concentration). Regions with reference character S/D denote a width directional distribution impurity concentration of P-type impurities contained in the first and the second source drain region 48 and 50 (a distribution of the third predetermined concentration).

As illustrated in FIG. 2, the impurity concentration (CD) of the high-concentration channel injection region 42, except in the vicinity on both sides of the region 42, is higher than the impurity concentration (Sub) of the substrate 36, i.e., the concentration of the first and the second low-concentration channel injection region 44 and 46. Likewise, the impurity concentration (S/D) of the first and the second source drain region 48 and 50, except in the vicinity on both sides of the regions 48 and 50, is higher than the impurity concentration (Sub) of the first and the second low-concentration channel injection region 44 and 46.

According to the above settings, it is possible to form within the gate region 40 those regions of a low impurity concentration, i.e., the first and the second low-concentration channel injection region 44 and 46, while sufficient quantities of impurities are implanted into the first source drain region 48, the second source drain region 50 and the gate region 40. When such low impurity concentration regions are formed inside the gate region 40, the probability of carriers colliding with impurities therein is reduced. This allows the semiconductor device 34 of the first embodiment to secure a high operation speed.

Furthermore, the settings above keep to a minimum the concentration of impurities in the vicinity of the PN junctions while sufficient quantities of impurities are implanted into the first source drain region 48, the second source drain region 50, and the gate region 40. This allows the semiconductor device 34 of the first embodiment to ensure high breakdown strength at the PN junctions, minimize the junction capacitance stemming from the PN junctions, and reduce effectively the number of hot carriers generated near the PN junctions.

In the semiconductor device 34 of the first embodiment, as shown in FIG. 2, the impurity concentration (CD) of the high-concentration channel injection region 42 is set to be higher than the impurity concentration (S/D) of the first and the second source drain region 48 and 50. The depletion layers created near the PN junctions expand or contract depending on the environment in which the semiconductor device 34 is used. The expansion and contraction of the depletion layers are more likely produced in regions at low impurity concentrations than in high impurity concentration regions. This means that in the semiconductor device 34 of the first embodiment, the depletion layers are more likely to expand and contract inside the first and the second source drain region 48 and 50 than inside the high-concentration channel injection region 42.

The operation threshold value of the semiconductor device 34 is influenced by the length of the gate formed between the first and the second source drain region 48 and 50. Such influence increases as miniaturization of the semiconductor device 34 progresses. Thus to make the semiconductor device 34 smaller while keeping its operation threshold value stable requires that the gate length of the semiconductor device 34 be stabilized against fluctuations in its use environment.

As described, one feature of the semiconductor device 34 practiced as the first embodiment is that depletion layers are allowed to expand and contract mainly inside the first and the second source drain region 48 and 50. In this setup, those changes in the gate length which occur in keeping with the expansion and contraction of the depletion layers are minimized. In that respect, the semiconductor device 34 is advantageous to be made smaller in size while maintaining the stability of its operation threshold value.

Figure 3:
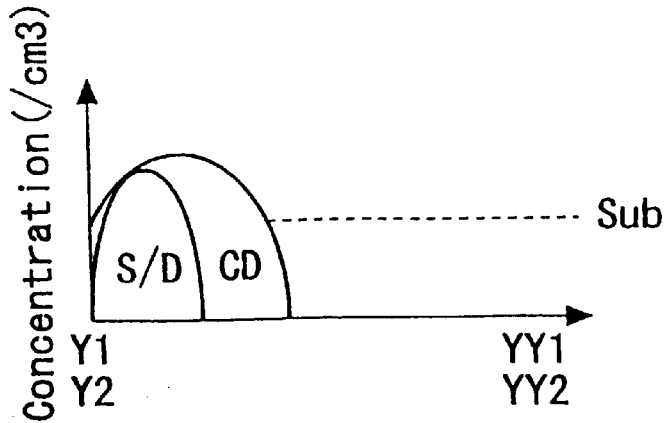
FIG. 3 is a graphic representation showing impurity concentrations in the semiconductor device practiced as a first embodiment of this invention taken along lines Y1-YY1 and Y2-YY2 in FIG. 1.

FIG. 3 is a graphic representation showing impurity concentrations in the semiconductor device 34 taken along line Y1-YY1 or Y2-YY2 in FIG. 1. In FIG. 3, a broken line with reference character "Sub" indicates a level of the concentration of impurities in the substrate 36. A region marked by reference character CD represents the concentration of impurities along line Y2-YY2, i.e., depth direction distribution of N-type impurities contained in the high-concentration channel injection region 42. A region with reference character S/D denotes the concentration of impurities taken along line Y1-YY1, i.e., depth direction distribution of P-type impurities contained in the first and the second source drain region 48 and 50 (distribution of impurities at the third predetermined concentration).

In the first embodiment, the impurities in the first and the second source drain region 48 and 50 are distributed more closely to the surface of the substrate 36 (i.e., in shallow regions) than the impurities in the high-concentration channel injection region 42 as shown in FIG. 3. In this setup, depletion layers created near the PN junctions locates in shallower regions than the high-concentration channel injection region 42. According to the foregoing structure, expansion of the depletion layers in the depth direction is effectively prevented by the high-concentration channel injection region 42.

If depletion layers are readily capable of expansion in the depth direction, then a-depletion layer expanding from the first source drain region 48 and another depletion layer expanding from the second source drain region 48 would approach each other under the high-concentration channel injection region 42 and eventually come into contact with each other. In such a case, there would be problems such as fluctuations in the operation threshold value of the semiconductor device 34 and malfunctions such as a punch-through state. By contrast, the semiconductor device 34 of the first embodiment is structured so as to prevent the expansion of depletion layers in the depth direction. The structure makes it possible to circumvent these potential problems, whereby the semiconductor device 34 is made smaller than before in size while its stability of operation threshold value and operational characteristic is maintained.

In the first embodiment described above, the semiconductor device 34 was shown as P-channel transistors. Alternatively, the semiconductor device 34 may be made of N-channel transistors as mentioned earlier. In the alternative case, P-type impurities such as B or $BF_2$ are implanted into the substrate or wells serving as the basis on which to build the semiconductor device 34. Impurities of the same type are also implanted into the high-concentration channel injection region 42. On the other hand, N-type impurities such as P or As are implanted into the first and the second source drain region 48 and 50.

Figure 4:
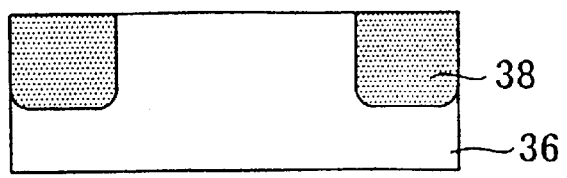
FIGS. 4 through 15 are cross-sectional views for explaining procedures performed during manufacturing process of the semiconductor device shown in FIG. 1.

A typical method for manufacturing the semiconductor device 34 as the first embodiment will now be described with reference to FIGS. 4 through 15. As shown in FIG. 4, manufacture of the semiconductor device 34 involves initially forming (in step 1) isolating regions 38 on the substrate 36 containing impurities at a first predetermined concentration ($10^{14}$ to $10^{15}$ atoms/$cm^3$). Where the semiconductor device 34 is to comprise P-channel transistors, a substrate 36 containing N-type impurities such as P or As is used. If the semiconductor device 34 is to be composed of N-channel transistors, a substrate 36 containing P-type impurities such as B or $BF_2$ is employed. The isolating regions 38 are each formed through oxide film isolation (trench isolation) or through LOCOS isolation. The process above when carried out forms island-like element regions on the substrate 36.

Figure 5:
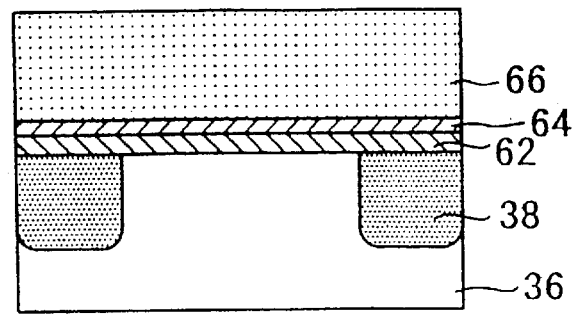

As depicted in FIG. 5, a bottom oxide film 62 having a film thickness of 150 to 300 angstroms is deposited on the substrate 36 and isolating regions 38 (step 2). A middle nitride film 64 with a film thickness of 80 to 150 angstroms is deposited on the bottom oxide film 62 (step 3). In addition, a top oxide film 66 having a thickness of 2,000 to 3,000 angstroms is deposited on the middle nitride film 64 (step 4). The bottom oxide film 62 serves as a protective film protecting the surface of the substrate 36 at the time of impurity implantation. The middle nitride film 64 acts as a stopper film during etching of the top oxide film 66.

Figure 6:
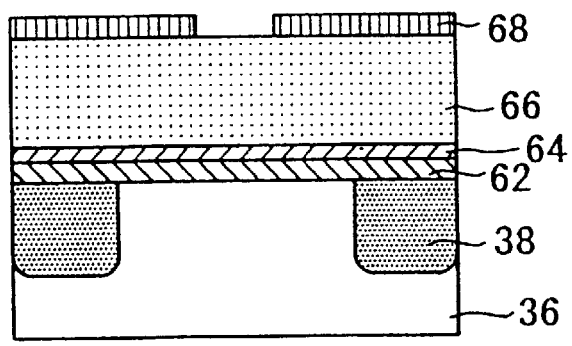

As shown in FIG. 6, a photoresist 68 is formed over the top oxide film 66. The photoresist 68 is patterned by photolithography so as to have openings matching gate regions 40 of the semiconductor device 34 (step 5).

Figure 7:
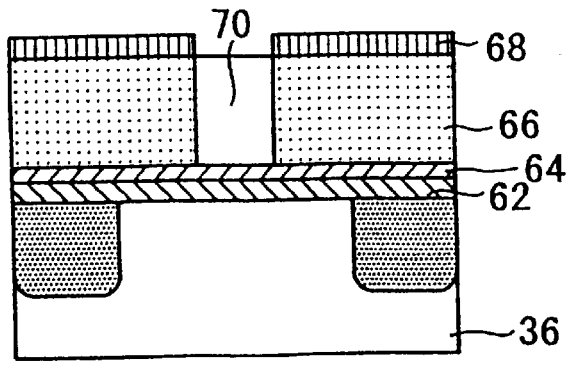

As illustrated in FIG. 7, those portions of the top oxide film 66 which correspond to the gate regions 40 of the semiconductor device 34 are removed by anisotropic etching to form openings 70 (step 6). The etching of the top oxide film 66 is carried out under conditions affording a sufficient selection ratio with respect to a silicon nitride film. In the etching process, the middle nitride film 64 functions as an etching stopper film.

After the openings 70 are formed, the photoresist 68 is removed by dry or wet etching from the surface of the top oxide film 66 (step 7). Then those portions of the middle nitride film 64 which are exposed to the openings 70 are removed by anisotropic etching, whereby the openings 70 are enlarged (step 8). The openings 70 thus enlarged are called the gate-use openings 72 hereunder.

In step 8, the middle nitride film 64 is etched under conditions affording a sufficient selection ratio with respect to a silicon oxide film. Under such etching conditions, the necessary portions of the middle nitride film 64 are removed selectively without causing much damage to the bottom oxide film 62. In this manner, the gate-use openings 72 are formed while the bottom oxide film 62 is adjusted precisely in film thickness.

Figure 8:
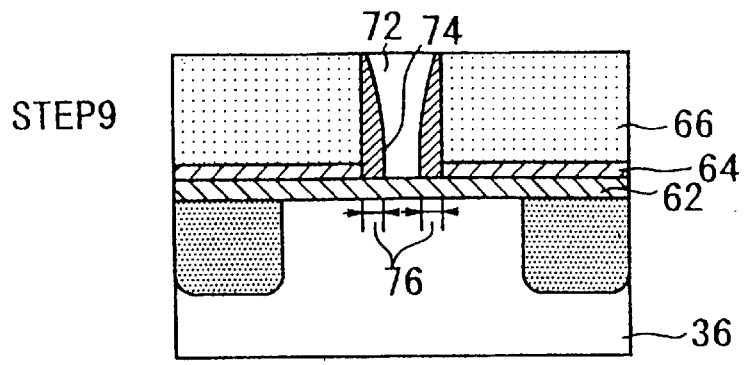

As shown in FIG. 8, a side wall 74 having a predetermined film thickness is deposited over the inner surface of each gate-use opening 72 (step 9). The side wall 74 is formed by initially depositing polysilicon about 500 to 800 angstroms thick in the interior of the gate-use openings 72, and then by removing the central portion of the deposited polysilicon from each opening by anisotropic etching. Carrying out step 9 forms offset regions 76 covered with the bottom of the side walls 74 in those areas that correspond to the gate regions 40 of the semiconductor device 34. With this manufacturing method, the side walls 74 are formed so that the offset regions 76 correspond to the first and the second low-concentration channel injection region 44 and 46 of the semiconductor device 34 and that the inside of each offset region 76 corresponds to the high-concentration channel injection region 42.

Figure 9:
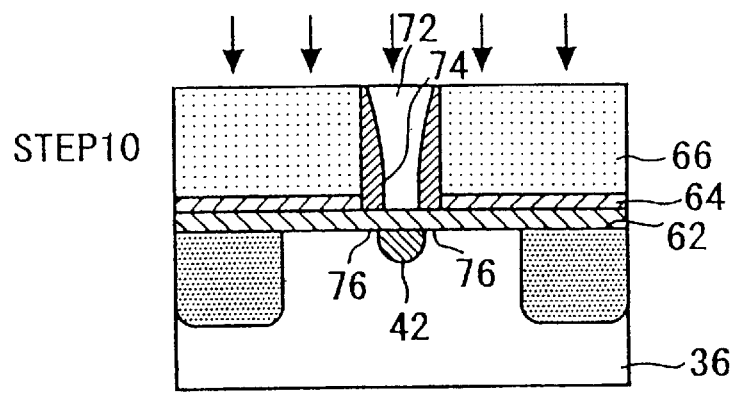

As depicted in FIG. 9, impurity ions are implanted into the substrate 36 after the formation of the side walls 74 (step 10). The impurity ions supplied toward the substrate 36 pass through the gate-use openings 72 to reach the bottom oxide film 62 and the substrate 36. In this case, the ions are implanted into the interior of the offset regions 76, i.e., only into the portions corresponding to the high-concentration channel injection region 42.

In step 10, the substrate 36 receives the same type of impurities as that of the impurities already contained therein. Specifically, if the semiconductor device 34 is to be composed of P-channel transistors, N-type impurities such as P or As are implanted into the substrate 36; if the semiconductor device 34 is to be made of N-channel transistors, P-type impurities such as B or $BF_2$ are implanted into the substrate 36. With this manufacturing method, the impurity ions are implanted at a concentration of $10^{12}$ to $10^{14}$ atoms/cm$^2$ using an amount of energy of 30 to 70 KeV.

The steps above when carried out effectively prevent the impurities from infiltrating into the offset regions 76. Thus the inventive manufacturing method makes it possible to form easily and precisely the high-concentration channel injection region 42 as well as the first and the second low-concentration channel injection region. During the impurity implantation process, the surface of the substrate 36 is protected by the bottom oxide film 62. Furthermore, the inventive fabrication method allows the bottom oxide film 62 to be controlled accurately in film thickness. Where the bottom oxide film 62 is adjusted with precision in terms of film thickness, implanting the impurities through the film 62 can still create the desired impurity distribution accurately inside the substrate 36. In this manner, the inventive method allows the implanted impurities to be distributed precisely and as desired within the high-concentration channel injection region 42 without causing appreciable damage to the surface of the substrate 36.

Figure 10:
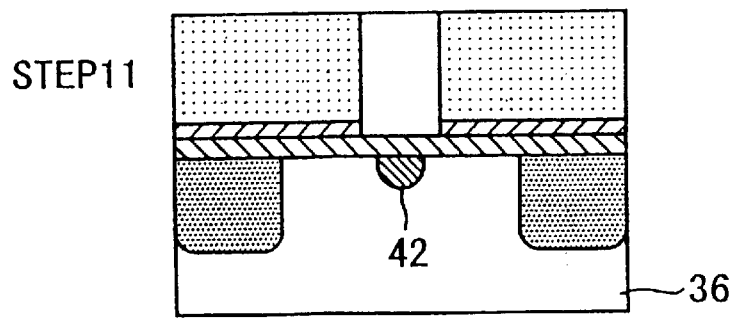

As illustrated in FIG. 10, the side walls 74 are removed by wet etching (step 11) upon completion of the impurity implantation into the high-concentration channel injection region 42. The etching of the side walls 74 is carried out in a way that removes polysilicon under conditions affording a high selection ratio with respect to a silicon oxide film and a silicon nitride film.

Figure 11:
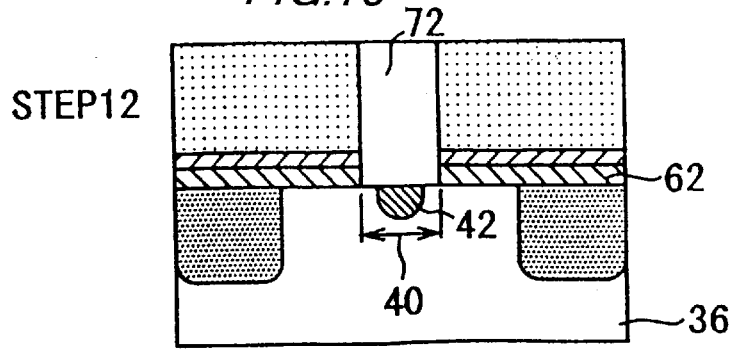

As shown in FIG. 11, those portions of the bottom oxide film 62 which are exposed to the gate-use openings 72, i.e., those areas of the bottom oxide film 62 which correspond to the gate regions 40, are removed by etching (step 12). In step 12, the bottom oxide film 62 is removed selectively by wet etching under conditions such as to keep the silicon substrate 36 from getting damaged.

Figure 12:
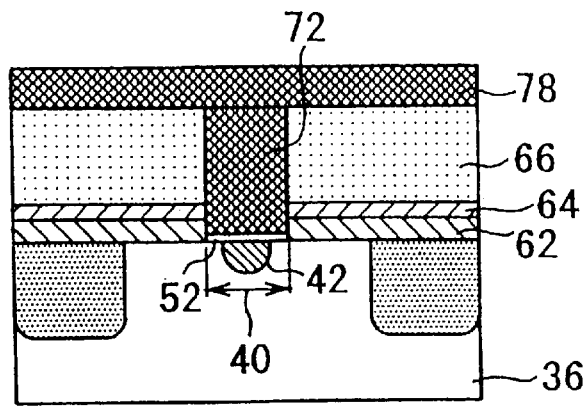

As indicated in FIG. 12, a gate oxide film 52 with a film thickness of 70 to 100 angstroms is formed on the exposed gate regions 40 (step 13). Then doped polysilicon 78 (or doped amorphous silicon) is deposited by low- or normal-pressure CVD on top of the gate oxide film 52, i.e., inside the gate-use openings 72 and over the top oxide film 66 (step 14).

Figure 13:
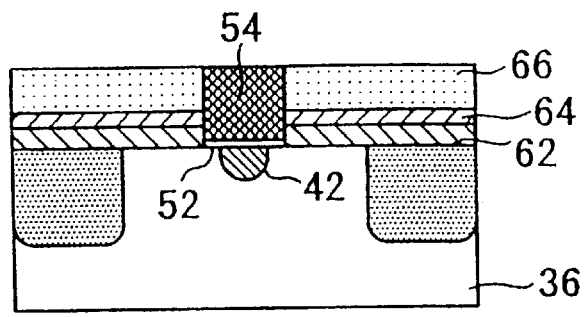

As shown in FIG. 13, the doped polysilicon 78 and the top oxide film 66 are removed either by CMP (chemical mechanical polishing) or by anisotropic etching to a predetermined film thickness (step 15). The steps above when carried out form gate electrodes 54 that are made of the doped polysilicon over the gate oxide film 52.

Figure 14:
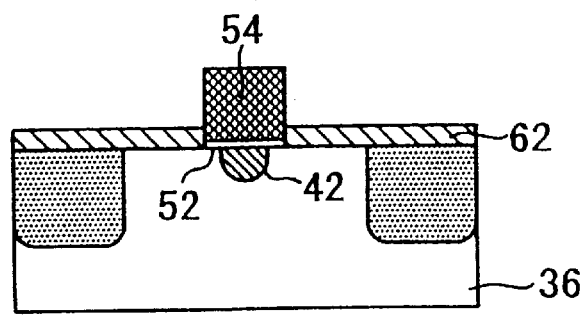

The top oxide film 66 remaining around the gate electrodes 54 is removed by wet etching as illustrated in FIG. 14 (step 16). The top oxide film 66 is etched under conditions ensuring a high selection ratio with respect to the doped polysilicon and silicon nitride film. the middle nitride film 64 remaining around the gate electrodes 54 is removed by wet etching after the removal of the top oxide film 66 (step 17). The etching of the middle nitride film 64 is performed under conditions ensuring a high selection ratio with respect to the doped polysilicon and silicon oxide film. Carrying out step 17 removes the middle nitride film without causing much damage to the bottom oxide film 62 that still remains around the gate electrodes 54. Thus the inventive manufacturing method readily allows the surface of the substrate 36 to be covered around the gate electrodes with the bottom oxide film 62 that is controlled precisely in film thickness.

Figure 15:
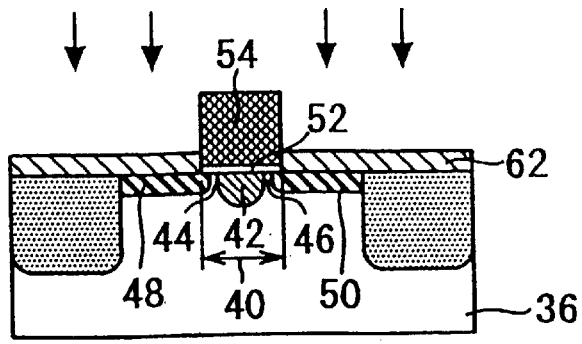

As shown in FIG. 15, impurity ions are implanted into the substrate 36 through the bottom oxide film 62 (step 18). The gate electrodes 54 and gate oxide film 52 prevent the impurities from passing through. This causes the impurities to reach only the vicinity of the gate electrodes 40. The process above causes the first and the second source drain region 48 and 50 to be formed on both sides of each gate region 40 with low impurity concentration regions (i.e., first and second low-concentration channel injection regions 44 and 46) left intact under the gate oxide film 52.

The impurities implanted into the substrate 36 in step 18 are of a type different from that of the impurities already contained in the substrate 36. Specifically, if the semiconductor device 34 is to be made of P-channel transistors, then P-type impurities such as B or $BF_2$ are implanted into the substrate 36; if the semiconductor device 34 is to be composed of N-channel transistors, then N-type impurities such as P or As are implanted into the substrate 36. With this manufacturing method, the impurity ions are implanted at a concentration of $10^{11}$ to $10^{13}$ atoms/cm$^2$ using an amount of energy of 15 to 30 KeV.

Under the energy condition above, the impurities in the first and the second source drain region are distributed in such a manner that distribution peaks appear 100 to 300 angstroms down from the surface of the substrate 36. Into the high-concentration channel injection regions, as described, the impurity ions are implanted using an amount of energy of 30 to 70 KeV. In the latter case, the impurities are distributed in such a manner that distribution peaks appear 300 to 400 angstroms down from the surface of the substrate 36. Thus the inventive manufacturing method satisfies the relationship shown in FIG. 3, i.e., that the depth of impurities distributed in the high-concentration channel regions must be greater than the depth of impurities distributed in the first and the second source drain region 48 and 50.

Under the implantation quantity conditions above, the concentration of the impurities implanted into the first and the second source drain region can be made lower than the impurity concentration of the high-concentration channel injection region 42 (implantation condition: $10^{12}$ to $10^{14}$ atoms/cm$^2$) and higher than the impurity concentration of the substrate 36 ($10^{14}$ to $10^{15}$ atoms/cm$^3$). In that respect, the inventive manufacturing method satisfies the relationship shown in FIG. 2, i.e., that the impurity concentration (CD) of the high-concentration channel injection region 42 must be greater than the impurity concentration (S/D) of the first and the second source drain region 48 and 50, the concentration (S/D) in turn being greater than the impurity concentration (Sub) of the first and the second low-concentration channel region 44 and 46.

Upon completion of step 18 during fabrication of the semiconductor device 34, the bottom oxide film 62 is removed (step 19); an interlayer film 56 with a thickness of 2,000 to 3,000 angstroms is deposited (step 20); and contacts 58 as well as metal wiring 60 are formed (step 21; see FIG. 1). Furthermore, annealing is carried out during manufacture of the semiconductor device 34 under a condition in which thermal expansion of the impurities is sufficiently inhibited. More specifically, annealing is performed at temperatures low enough to suppress sufficiently the thermal expansion of the impurities. Alternatively, lamp annealing capable of rapid heating and cooling may be carried out (step 22). This type of anneal processing activates the impurities without disturbing the relationship between the impurity concentrations shown in FIG. 2 or the impurity distribution relationship depicted in FIG. 3.

As described above, the inventive method for manufacturing a semiconductor device meets easily and reliably the requirements associated with the structure, impurity distribution and impurity concentrations of the semiconductor device 34 when the latter is manufactured as the first embodiment of the invention. As such, the inventive method allows the semiconductor device 34 shown in FIG. 1 to be manufactured at a high yield rate.

Second Embodiment

Figure 16:
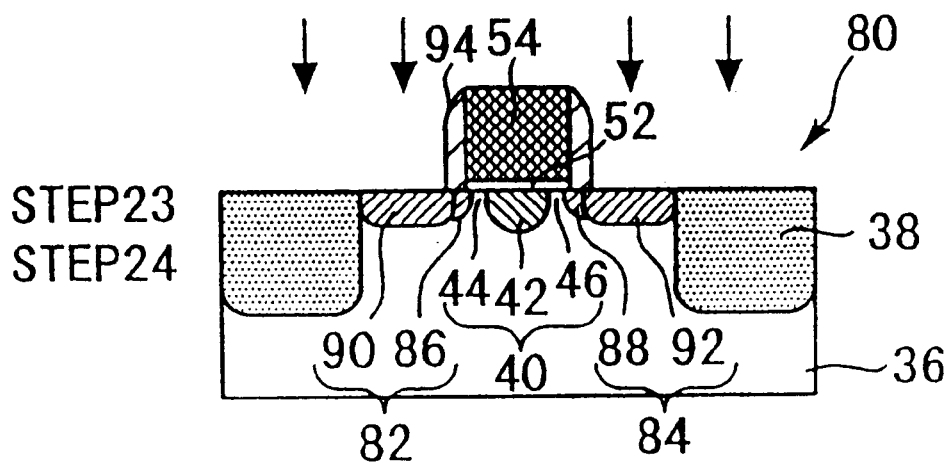
FIG. 16 is a cross-sectional views for explaining procedures performed during manufacturing process of a semiconductor device practiced as a second embodiment of this invention.

A second embodiment of this invention will now be described with reference to FIG. 16. FIG. 16 is a cross-sectional view showing principal elements of a semiconductor device 80 practiced as the second embodiment of the invention. The semiconductor device 80 is characterized in that it is a variation of the first embodiment adapted to what is known as a lightly doped drain (LDD) structure.

The semiconductor device 80 has a first and a second source drain region 82 and 84 furnished on both sides of each gate region 40. The first and the second source drain region 82 and 84 are provided respectively with LDD regions 86, 88 and ordinary injection regions 90, 92. The LDD regions 86 and 88 contain impurities at a relatively low concentration; the ordinary injection regions 90 and 92 contain impurities at a relatively high concentration.

In the semiconductor device 80 of the second embodiment, the gate electrodes 54 are each surrounded by an insulating side wall 94. The insulating side wall 94 is made of a silicon nitride film, silicon oxide film, or silicon nitride/oxide film. The above-mentioned LDD regions 86 and 88 are formed so that their edges overlie with the insulating side walls 94. The ordinary injection regions 90 and 92 are furnished outside the insulating side walls 94. This structure allows the electric field intensity of PN junctions to be made still lower than in the semiconductor device 34 of the first embodiment. Because the semiconductor device 80 thus structured effectively inhibits generation of hot carriers, the second embodiment provides more stable performance characteristics than the first embodiment.

During manufacture of the semiconductor device 80 as the second embodiment, carrying out step 18 (see FIG. 15) forms the LDD regions 86 and 88. Following step 19 (i.e., removal of the bottom oxide film), the insulating side walls 94 are formed around the gate electrodes 54 (step 23). When edges of the LDD regions 86 and 88 have been covered with the insulating side walls 94, more impurities are implanted into the substrate 36 (step 24). Carrying out step 24 forms outside the insulating side walls 94 the ordinary injection regions 90 and 92 having an impurity concentration higher than that of the LDD regions 86 and 88. Thereafter, an interlayer film 56 and metal wiring 60 are formed in the same manner as with the first embodiment.

Third Embodiment

Figure 17:
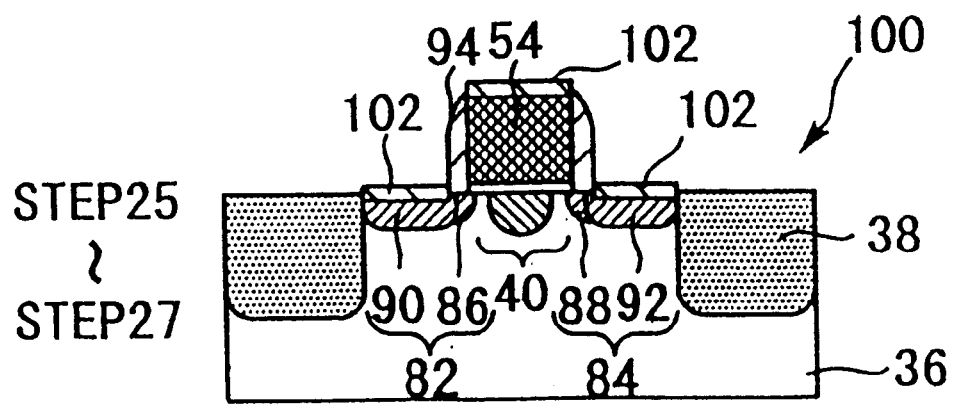
FIG. 17 is a cross-sectional views for explaining procedures performed during manufacturing process of a semiconductor device practiced as a second embodiment of this invention.
Figure 18:
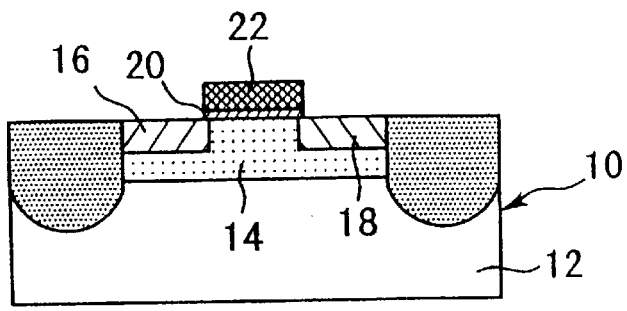
FIG. 18 is a cross-sectional view of a former MIS type transistor.
Figure 19:
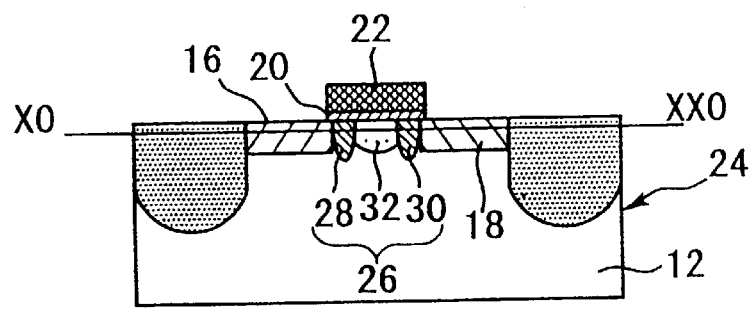
FIG. 19 is a cross-sectional view of another former MIS type transistor.
Figure 20:
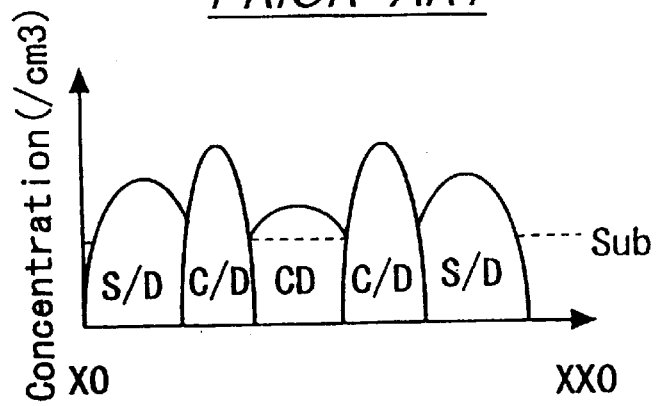
FIG. 20 is a graphic representation showing impurity concentrations in the former MIS type transistor taken along line XO-XXO in FIG. 1.

A third embodiment of this invention will now be described with reference to FIG. 17. FIG. 17 is a cross-sectional view showing principal elements of a semiconductor device 100 practiced as the third embodiment of the invention. As with the semiconductor device 80 of the second embodiment, the semiconductor device 100 of the third embodiment has an LDD structure. The semiconductor device 100 is characterized in that it has silicide 102 deposited over the surface of the first and the second source drain region 82 and 84 as well as over the surface of the gate electrodes 54.

To have the semiconductor device 100 operated at high speed requires minimizing its wiring resistance. The silicide 102 has lower resistivity than doped polysilicon and doped morphous silicon. This allows the semiconductor device 100 of the third embodiment to have a lower level of wiring resistance and thereby to run at a higher speed than the first or the second embodiment.

The semiconductor device 100 has the LDD structure as mentioned. More specifically, the semiconductor device 100 has the gate electrodes 54 surrounded laterally by insulating side walls 94 that insulate the electrodes 54 from the first and the second ordinary injection region 90 and 92. With this structure, the semiconductor device 100 may have the silicide 102 covering the surface of the gate electrodes 54 and of the first and the second source drain region 82 and 84 without short-circuiting these parts.

During manufacture of the semiconductor device 100 as the third embodiment, carrying out step 24 forms the ordinary injection regions 90 and 92. With the regions 90 and 92 thus furnished, refractory metal such as titanium, tungsten or cobalt is deposited all over the substrate 36 (step 25). A lamp or furnace annealing process is then carried out to effect thermal processing whereby silicon and the refractory metal are reacted to create silicide 102 (step 26). After the refractory metal is removed by selective etching from unnecessary portions (step 27), an interlayer 56 and metal wiring 60 are provided in the same manner as with the first embodiment.

The major benefits of the present invention described above are summarized as follows:

According to a first aspect of the invention, there is provided a semiconductor device wherein PN junctions are formed at boundaries between the first and the second source drain region on the one hand and the first and the second low-concentration channel injection region on the other hand. This structure prevents impurities from getting highly concentrated near the PN junctions. This makes it possible for the inventive semiconductor device to ensure sufficiently high junction breakdown strength, to suppress junction capacitance adequately, and to inhibit generation of hot carriers effectively. The semiconductor device also has high-concentration channel regions (with high concentration of impurities) formed inside the gate regions. Depletion layers created near the PN junctions are prevented from extending into areas of high impurity concentrations, i.e., into the high-concentration channel regions. This makes it possible to secure a minimum gate length while keeping the operation threshold value stable in the semiconductor device.

In one preferred structure according to the first aspect of the invention, the concentration of impurities in the first and the second source drain region may be made higher than the impurity concentration in the first and the second low-concentration channel injection region and lower than the concentration in the high-concentration channel injection region. This preferred structure reliably prevents depletion layers from extending into the high-concentration channel injection region, whereby the operation threshold value of the semiconductor device is kept stable.

In another preferred structure of the invention, the impurities in the first and the second source drain region may be distributed in shallower locations than in the high-concentration channel injection region, i.e., close to the surface of the substrate or wells (base). This preferred structure prevents depletion layers from expanding in the width and depth directions on the side of the high-concentration channel injection region. As a result, the operation threshold value of the inventive semiconductor device is kept stable.

In a further preferred structure of the invention, silicide may be deposited on portions where electrical connections are to be ensured. This preferred structure effectively suppresses the wiring resistance of the semiconductor device.

In an even further preferred structure of the invention, insulating side walls may be provided to surround laterally each gate electrode. This preferred structure reduces wiring resistance while insulating reliably the gate electrodes from the first and the second source drain region.

According to a second aspect of the invention, there is provided a manufacturing method whereby the inner surface of each gate-use opening is furnished with a side wall so that part of the gate regions on the base are covered with side walls. When impurities are implanted in this state, the high-concentration channel region is unfailingly made smaller than the gate region. Thereafter, the first and the second source drain region are formed outside the gate region. As a result, the first or the second low-concentration channel region is formed reliably between the first and the second source drain region on the one hand and the high-concentration channel region on the other hand.

By one preferred method according to the second aspect of the invention, the high-concentration channel injection region may be formed first, followed by a gate insulating film covering the entire gate region as well as gate electrodes. When impurities are implanted into the first and the second source drain region, the gate insulating film and gate electrodes prevent the impurities from infiltrating the gate region. This preferred manufacturing method thus allows the semiconductor device to be structured as required easily and reliably.

By another preferred method of the invention, an interlayer film having gate-use openings may be formed without causing appreciable damage to the substrate or wells. This makes it possible to manufacture the semiconductor device at a high yield rate.

Further, the present invention is not limited to these embodiments, but variations and modifications may be made without departing from the scope of the present invention.

The entire disclosure of Japanese Patent Application No. Hei10-217941 filed on Jun. 31, 1998 including specification, claims, drawings and summary are incorporated herein by reference in its entirety.

What is claimed is:

1. A method for manufacturing a semiconductor device comprising the steps of:

forming a base constituted either by a substrate including first impurities at a first predetermined concentration or by wells which include said first impurities at said first predetermined concentration and which are formed on a substrate;

forming on said base an interlayer film having gate-use openings over a gate region; wherein said step of forming said interlayer film further comprises the steps of:

forming in a layered manner a bottom oxide film, a middle nitride film and a top oxide film on said base;

removing those portions of said top oxide film which correspond to said gate region under etching conditions affording a sufficiently high selection ratio with respect to said middle nitride film; and removing those portions of said middle nitride film which correspond to said gate region under etching conditions affording a sufficiently high selection ratio with respect to said bottom oxide film;

forming side walls of predetermined thickness over an inner surface of each of said gate-use openings;

using the side walls as a mask, implanting into said gate-use openings ions of second impurities of a type identical to that of said first impurities in order to form, in the vicinity of a surface of said base, a high-concentration channel injection region which is smaller than said gate region and which includes said second impurities at a second predetermined concentration higher than said first predetermined concentration; and ion implanting impurities of a conductivity type different from that of the first and second impurities to form a first and a second source drain region which are respectively arranged on opposite sides of said gate region, leaving first and second low-concentration channel injection regions on each side of, and of the same conductivity type as, the high-concentration channel injection region, which low concentration and high-concentration channel injection regions extend from an upper surface of the base, the method further comprising the sequential steps of:

removing said side wall; and forming a gate insulation film and gate electrodes on said gate region;

wherein the steps of removing said side walls and forming said gate insulation film and gate electrodes are carried out after said step of forming said high-concentration channel injection region and before said step of forming said first and said second source drain region.

2. The method for manufacturing a semiconductor device according to claim 1, wherein the step of forming said interlayer insulating film further comprises the sequential steps of:

forming a photoresist mask on said oxide film;

etching to remove the portions of said top oxide film exposing said middle nitride film;

removing the photoresist mask; and etching to remove the portions of said middle nitride film exposing said bottom oxide film.

3. The method of manufacturing a semiconductor device according to claim 1, comprising forming the sidewalls such that they extend down to said bottom oxide film.

* * * * *

UNITED STATES PATENT AND TRADEMARK OFFICE
CERTIFICATE OF CORRECTION

PATENT NO.     : 6,479,356 B1
DATED          : November 12, 2002
INVENTOR(S)    : Takeru Matsuoka It is certified that error appears in the above-identified patent and that said Letters Patent is hereby corrected as shown below:

<u>Title page,</u>
Item [73], Assignee, change "Mitsubishi Denki Kabushi Kaisha" to
-- Mitsubishi Denki Kabushiki Kaisha --

Signed and Sealed this

Eighth Day of April, 2003

JAMES E. ROGAN
*Director of the United States Patent and Trademark Office*